(12) United States Patent
Chien et al.

(10) Patent No.: US 6,274,397 B1
(45) Date of Patent: Aug. 14, 2001

(54) METHOD TO PRESERVE THE TESTING CHIP FOR PACKAGE'S QUALITY

(75) Inventors: Wen-Cheng Chien, Kaohsiung (TW); Ho-Yin Yiu, Kowloon (HK); Hui-Chen Chu, Kaohsiung (TW)

(73) Assignee: Taiwan Semiconductor Manufacturing Company Ltd., Hsin-Chu (TW)

( * ) Notice: Subject to any disclaimer, the term of this patent is extended or adjusted under 35 U.S.C. 154(b) by 0 days.

(21) Appl. No.: 09/323,351

(22) Filed: Jun. 1, 1999

(51) Int. Cl.[7] .............................. H01L 21/66; G01R 31/26
(52) U.S. Cl. .......................... 438/15; 324/765; 324/769; 438/17
(58) Field of Search ............................ 438/14–15, 17, 438/127; 324/765–769

(56) References Cited

U.S. PATENT DOCUMENTS

| | | | |
|---|---|---|---|
| 4,173,820 | * 11/1979 | Mueller et al. | 29/572 |
| 5,366,589 | 11/1994 | Chang | 156/657 |
| 5,490,324 | 2/1996 | Newman | 29/830 |
| 5,731,246 | 3/1998 | Bakeman, Jr. et al. | 438/770 |
| 5,793,118 | * 8/1998 | Nakajima | 257/790 |
| 5,837,558 | * 11/1998 | Zuniga et al. | 438/15 |
| 5,858,806 | * 1/1999 | Nishida | 438/7 |
| 5,925,260 | * 7/1999 | Jiang | 216/7 |
| 6,114,181 | * 9/2000 | Gregoritsch, Jr. | 438/15 |

* cited by examiner

*Primary Examiner*—Richard Booth
(74) *Attorney, Agent, or Firm*—George O. Saile; Stephen B. Ackerman

(57) ABSTRACT

A method for eliminating metal line corrosion for semiconductor packages where exposed metal lines are exposed to the atmosphere for an extended period of time. A passivation layer is deposited over the active die of the semiconductor package, a layer of polymer film is deposited over the passivation layer and over the exposed conducting lines. At the time that the semiconductor package must be tested, including testing for corrosion of the exposed metal lines, the polymer layer is removed and the molding compound is applied. The semiconductor package is now tested. The added step of depositing a layer of polymer film has protected the interconnecting conducting lines from corrosion.

37 Claims, 1 Drawing Sheet

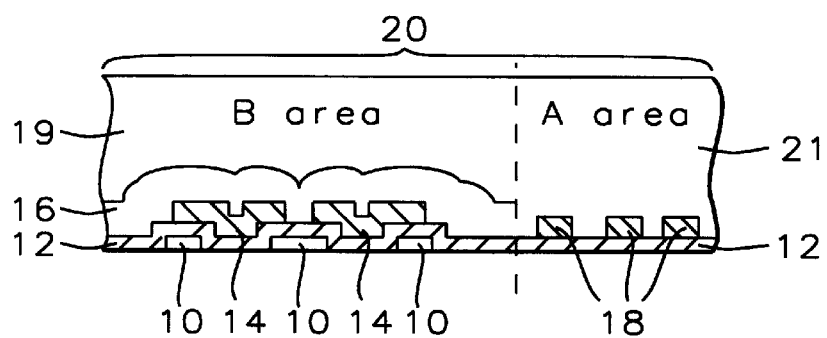
FIG. 1 – Prior Art
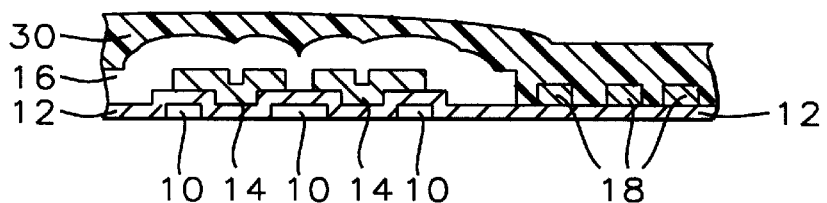
FIG. 2
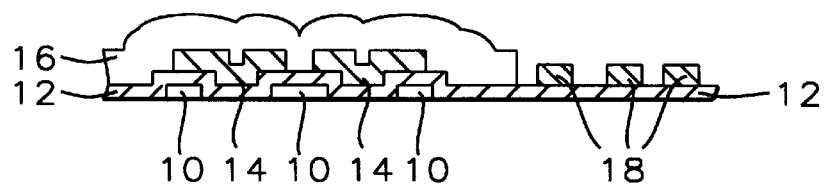
FIG. 3
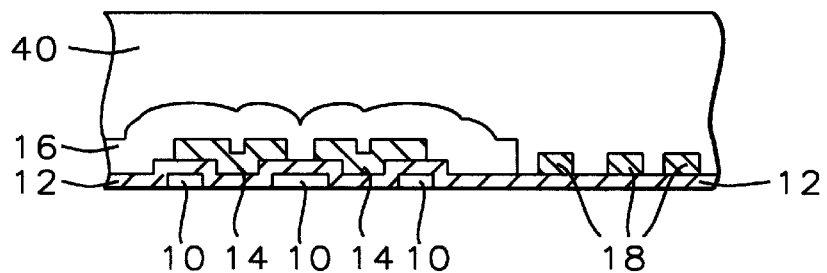
FIG. 4

METHOD TO PRESERVE THE TESTING CHIP FOR PACKAGE'S QUALITY

BACKGROUND OF THE INVENTION (1) Field of the Invention

The invention relates to the field of semiconductor circuit manufacturing, and more specifically to the field of preventing exposed metal line corrosion prior to the testing of semiconductor devices.

(2) Description of the Prior Art

Multi chip modules and other electronic devices are constructed using unpackaged or bare semiconductor dice. These unpackaged dice are, during the semiconductor manufacturing process, tested and burned in to assure that each die is a known good die. This has led to the creation of test carriers where a single or a multiplicity of die are assembled and tested and whereby the test carrier provides for electrical interaction between the die pads and external test circuitry.

It has been suggested that, during testing, a circuit forms on the die that causes pad leakage. This pad leakage can occur from the input or output pads on a die to other pads on the die such as ground pads, power pads and bias voltage pads. Pad leakage can further occur from a pad to the silicon substrate of a die or to another component of the die.

A number of semiconductor package designs include the design of an special circuit that serves to provide an electrical path form the input/output pads to a ground pad, or to a power pad or a bias voltage pad for the die. This electrical path is designed to be actuated by a high voltage, such as an electrostatic discharge, being applied to the input or output pads of the die. These special circuits may become defective further causing a pattern of leakage current across the semiconductor package.

A number of different types of semiconductor circuits can be used to form a VLSI integrated circuit package, circuits such as Pin Grid Array (PGA) and Ball Grid Array (BGA) can be part of this package. These various types of circuit packages can be mounted on a chip carrier where they can be further interconnected by means of conducting lines.

Packaged semiconductor dice are routinely checked for pad leakage and other electrical performance characteristics. A passivation layer is applied across the package over which a molding compound is deposited. The passivation layer is deposited first so that the molding compound can be applied, the passivation layer protects the electronic circuitry from the molding compound. The passivation layer would be deposited only over the electronic circuitry thus leaving the interconnecting conducting lines open and exposed to the atmosphere. These metal lines would therefore be subject to line corrosion. The present invention addresses a method to prevent line corrosion from happening while still being able to cover the completed electronic package with the molding compound.

FIG. 1 shows a Prior Art cross section of the semiconductor circuit package. Active semiconductor circuit chips 10 are shown. Over these chips a layer 12 of Plasma Enhanced oxide is deposited. Further package constructs 14 (dielectric) are indicated. A passivation layer 16 is deposited over constructs 14 and the layer 12 of PE oxide where this layer is in the immediate physical proximity of the active circuits 10. This passivation layer 16 shields the semiconductor circuits from the environment and from the to be deposited molding compound 20. The passivation layer further provides improved adhesion of the molding compound to the substrate, it reduces stress between the surface of the die and the molding compound, it improves resistance to moisture susceptibility and it decreases exposure to soft-error failure.

Area 19 as shown in FIG. 1 is a sub-section of the deposited molding compound 20, the passivation layer 16 has been deposited in this area. Area 21 is also a sub-section of the deposited molding compound 20, this area has been designed for corrosion testing and the passivation layer (16, for area 19) is therefore not deposited in this area. Area 19 contains the thermal stress test pattern, this thermal stress is measured by measuring the leakage current between the pattern 10 and the pattern 18.

Also shown are metal lines 18, these metal lines are, in the interval between formation of the semiconductor package (marked by the deposition of the passivation layer 16) and the formation of the molding compound 20, exposed to the atmosphere. This interval can last over a considerable length of time, up to weeks or even months. This exposure subjects the metal lines to atmospheric corrosive action that results in corrosion of the metal lines.

U.S. Pat. No. 5,366,589 (Chang) shows a passivation film over a bonding pad to prevent corrosion.

U.S. Pat. No. 5,490,324 (Newman) shows pads with molding compounds thereover.

U.S. Pat. No. 5,731,246 (Bakeman) shows a process to protect aluminum metallization against chemical attack during photoresist development.

SUMMARY OF THE INVENTION

It is the primary objective of the invention is to prevent corrosion of exposed conducting lines within a semiconductor package.

In accordance with the primary objective of the invention a method is presented for the elimination of metal line corrosion for semiconductor packages where metal lines are exposed to the atmosphere for an extended period of time. A passivation layer is deposited over the active die of the semiconductor package, a layer of polymer film is deposited over the passivation layer and over the exposed conducting lines. At the time that the semiconductor package must be tested, including testing for corrosion of the exposed metal lines, the polymer layer is removed, the molding compound is formed and the package is tested. The added step of depositing a layer of polymer film has protected the interconnecting conducting lines from corrosion.

BRIEF DESCRIPTION OF THE DRAWINGS

FIG. 1 shows a cross section of the integrated circuit during Prior Art circuit testing.

FIG. 2 shows a cross section of the integrated circuit after the deposition of the polymer film.

FIG. 3 shows a cross section of the integrated circuit after the polymer film has been removed.

FIG. 4 shows a cross section of the integrated circuit after the deposition of the molding compound.

DESCRIPTION OF THE PREFERRED EMBODIMENT

Referring now specifically to FIG. 2, there is shown a cross section of the semiconductor circuit package with package components 10 and 14, a layer 12 of PE oxide, the passivation layer 16, interconnecting metal lines 18. Further shown is a cross section of the deposited layer 30 of polymer film. The polymer film 30 is deposited with a spin coating process, the polymer film serves the purpose of protecting the exposed conducting metal lines against corrosion. It must be pointed out that this protection or preservation of the semiconductor package can extend over a period of weeks or even months. The potential length of this protection period should make it clear that leaving the exposed conducting lines unprotected and therefore exposed to the atmosphere is an unacceptable alternative. The semiconductor package as shown in the cross section of FIG. 2 can, since the interconnecting lines 18 are shielded form the atmosphere, remain in a dormant or storage stage for as long as required.

The polymer film can be spun onto the wafer and can contain polycarbonate (PC), polystyrene (PS), polyoxides (PO), polymethylmethacrylate (PMMA) and poly-polyoxides (PPO). It is important to use a material for the polymer film that can be applied by spin coating and that can, at a later stage, be easily removed by dipping the coated semiconductor package in a solvent. The polymer film must be of a material that is not bibulous and that rejects water absorption.

FIG. 3 shows a cross section after the protective polymer film (layer 30, FIG. 2) has been removed. This removal of the polymer film is performed at the time when it is required to further package, test and ship the semiconductor package. The removal of layer 30 (FIG. 2) can be done by dipping the package into a solvent. Solvents that can be used for this purpose include acetone, THF and trichloro-methane. The removal of the polymer is monitored and confirmed by visual inspection.

After the removal of the polymer film the semiconductor package can now be subjected to a test pattern that tests line corrosion, since the interconnecting lines have been shielded from the atmosphere line corrosion will not present a problem at this time.

FIG. 4 shows a cross section of the semiconductor package after the deposition of the final molding compound 40. The semiconductor package is now complete.

Although the preferred embodiment of the present invention has been disclosed for illustrative purposes, those skilled in the art will appreciate that various modifications, additions and substitutions are possible without departing from the scope and spirit of the invention as disclosed in the accompanying claims.

What is claimed is:

1. A method for protecting exposed conducting lines within an integrated circuit package, comprising:
    a printed circuit board having upper and lower opposed surfaces, the lower surface having a plurality of solderable pads;
    one or more semiconductor devices electrically and mechanically connected to the upper surface of the printed circuit board, said printed circuit board having exposed areas and electrically connected to the plurality of pads via the circuit board;
    a plasma enhanced (PE) layer of oxide deposited over said semiconductor devices further deposited over the exposed areas of said printed circuit board;
    a plurality of dielectric depositions said depositions deposited and etched over said layer of PE oxide and positioned above and aligned with said semiconductor devices;
    a plurality of interconnecting conducting lines deposited over said layer of PE oxide and having spaces therebetween and positioned at a location that is not in the immediate vicinity of said semiconductor devices and is not aligned with said semiconductor devices;
    a passivation layer deposited over said plurality of dielectric depositions further partially deposited over said PE oxide layer where this layer is in the immediate vicinity of said semiconductor devices; and
    a polymer layer deposited over said passivation layer further deposited over said plurality of interconnecting conducting lines and the spaces therebetween.

2. The method of claim 1 wherein said passivation layer contains silicon oxide ($SiO_2$).

3. The method of claim 1 wherein said passivation layer contains silicon nitride ($Si_3N_4$).

4. The method of claim 1 wherein said passivation layer contains a photo-sensitive polyimide.

5. The method of claim 1 wherein said passivation layer contains titanium nitride.

6. The method of claim 1 wherein said passivation layer is deposited by CVD.

7. The method of claim 1 wherein said polymer film contains polyimide.

8. The method of claim 1 wherein said polymer film contains patylene.

9. The method of claim 1 wherein said polymer film contains BCB (bi-benzocyclobutene).

10. The method of claim 1 wherein said polymer film contains PMMA (poly-methyl-methacrylate).

11. The method of claim 1 wherein said polymer film contains PC (polycarbonate).

12. The method of claim 1 wherein said polymer film contains PS (polysterene).

13. The method of claim 1 wherein said polymer film contains PO (polyoxide).

14. The method of claim 1 wherein said polymer film contains PPO (poly polyoxide).

15. The method of claim 1 wherein said polymer film contains Teflon made from PTFE (polytetrafluoroethylene).

16. A method for protecting and testing semiconductor packages, consisting of:
    manufacturing said semiconductor package;
    depositing a passivation layer over the circuit elements of said semiconductor package said passivation layer not to cover exposed conducting lines within said semiconductor package;
    depositing a layer of polymer film over said passivation layer further including exposed conducting lines within said semiconductor package;
    removing said polymer film;
    testing said semiconductor package for line corrosion;
    depositing a layer of molding compound; and
    testing said semiconductor package for line corrosion.

17. The method of claim 16 wherein said passivation layer contains silicon oxide ($SiO_2$).

18. The method of claim 16 wherein said passivation layer contains silicon nitride ($Si_3N_4$).

19. The method of claim 16 wherein said passivation layer contains a photo-sensitive polyimide.

20. The method of claim 16 wherein said passivation layer contains titanium nitride.

21. The method of claim 16 wherein said passivation layer is deposited by CVD.

22. The method of claim 16 wherein said polymer film contains polyamide.

23. The method of claim 16 wherein said polymer film contains patylene.

24. The method of claim 16 wherein said polymer film contains BCB (bi-benzocyclobutene).

25. The method of claim 16 wherein said polymer film contains PMMA (poly-methyl-methacrylate).

26. The method of claim 16 wherein said polymer film contains PC (polycarbonate).

27. The method of claim 16 wherein said polymer film contains PS (polysterene).

28. The method of claim 16 wherein said polymer film contains PO (polyoxide).

29. The method of claim 16 wherein said polymer film contains PPO (poly polyoxide).

30. The method of claim 16 wherein said polymer film contains Teflon made from PTFE (polytetrafluoroethylene).

31. The method of claim 16 wherein said removing said polymer film is dipping said polymer film in a solvent.

32. The method of claim 31 wherein said solvent contains trichloroethylene.

33. The method of claim 31 wherein said solvent contains trichloro-methane.

34. The method of claim 31 wherein said solvent contains acetone.

35. The method of claim 31 wherein said solvent contains p-xylene.

36. The method of claim 31 wherein said solvent contains methanol.

37. The method of claim 31 wherein said solvent contains ethanol.

* * * * *